(12) United States Patent
Lee et al.

(10) Patent No.: US 9,647,632 B2
(45) Date of Patent: May 9, 2017

(54) LUMPED ELEMENT RADIO FREQUENCY TUNING CALIBRATION PROCESS

(71) Applicant: Advantest Corporation, Tokyo (JP)

(72) Inventors: Donald M Lee, Sunnyvale, CA (US);
Heidi Barnes, Forestville, CA (US);
Kosuke Miyao, Sunnyvale, CA (US);
Bela Szendrenyi, Santa Rosa, CA (US);
Vanessa Bischler, Boeblinger (DE)

(73) Assignee: ADVANTEST CORPORATION, Tokyo (JP)

(*) Notice: Subject to any disclaimer, the term of this patent is extended or adjusted under 35 U.S.C. 154(b) by 612 days.

(21) Appl. No.: 14/166,516

(22) Filed: Jan. 28, 2014

(65) Prior Publication Data

US 2015/0162891 A1 Jun. 11, 2015

Related U.S. Application Data

(60) Provisional application No. 61/912,388, filed on Dec. 5, 2013.

(51) Int. Cl.
*G01R 31/28* (2006.01)
*H03H 7/40* (2006.01)

(52) U.S. Cl.
CPC .......... *H03H 7/40* (2013.01); *G01R 31/2822* (2013.01)

(58) Field of Classification Search
CPC .................................................. G01R 31/2822
USPC ........................................................... 702/85
See application file for complete search history.

(56) References Cited

U.S. PATENT DOCUMENTS

| | | | |
|---|---|---|---|
| 2002/0118034 A1* | 8/2002 | Laureanti | G01R 31/2822 324/762.09 |
| 2010/0073220 A1* | 3/2010 | Olesen | H04B 17/21 342/174 |

\* cited by examiner

*Primary Examiner* — Bryan Bui
(74) *Attorney, Agent, or Firm* — Manuel de la Cerra

(57) ABSTRACT

A preferred method for efficiently tuning RF ports while avoiding conventional labor intensive, step-by-step processes is disclosed. The method may use at least three tuning blocks (comprised of capacitors and inductors) in a series topology and at least three tuning blocks in a shunt topology. These tuning blocks will yield two circles that can be charted on the Smith chart. Those circles may then be centered along the centerline of the Smith chart to adjust for latency, and then expanded to adjust for the losses. Once those circles have been expanded, the circle (either series or shunt) that encompasses one the Smith chart reference circles is used and the traditional Smith chart methodology can be used to tune the RF port.

19 Claims, 8 Drawing Sheets

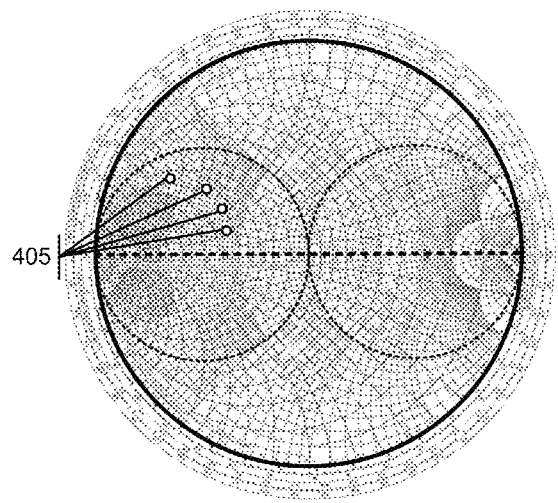
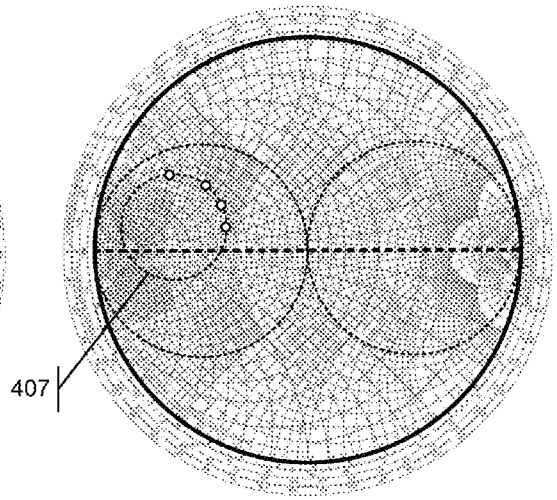
FIG. 4A      FIG. 4B
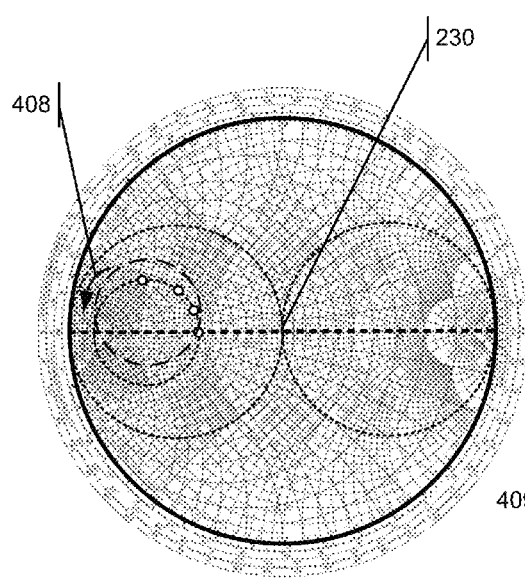
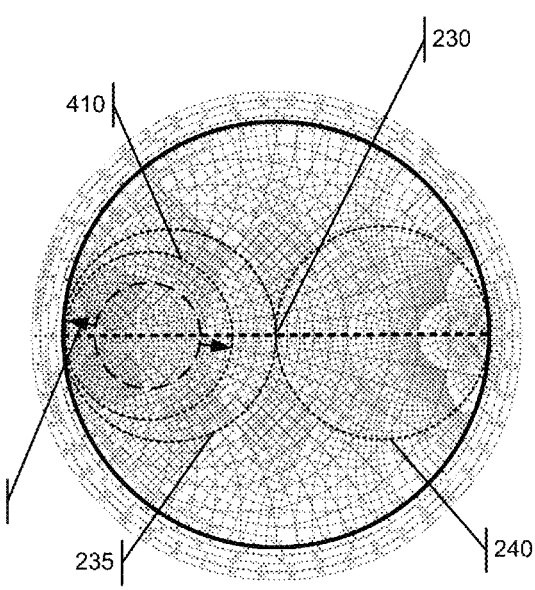
FIG. 4C      FIG. 4D

LUMPED ELEMENT RADIO FREQUENCY TUNING CALIBRATION PROCESS

1.0 TECHNICAL FIELD

The present disclosure relates generally to the field of lumped-element radio frequency (RF) tuning and more specifically to the field of a calibration process for lumped element RF tuning.

2.0 BACKGROUND

Electronics devices (e.g., cell phones, smart phones, wireless-enabled portable computing devices) that incorporate radio frequency (RF) components may require complicated and time-consuming RF tuning before they are able to be properly tested and assembled. As illustrated in FIGS. 1A and 1B, a plurality of devices under test (DUT) 104 may be connected to a device interface board 102. The DUTs 104 may be connected to the device interface board 102 via sockets. The device interface board 102 interconnects ports 106 of the DUTs 104 to a plurality of testing resources 110, which may include analyzers and processors. The device interface board 102 may also be known as a loadboard. While FIG. 1A illustrates a plurality of DUTs 104 on a device interface board 102 comprising tuning elements 108, FIG. 1B illustrates exemplary tuning elements 108 placed between a DUT 104 and one or more testing resources 110. The DUTs 104 may be located a fixed distance apart with fixed cabling distances between the testing resources 110 and each port 106 of the DUTs 104. Each port 106 of a DUT 104 will require a separate RF tuning process.

As also illustrated in FIGS. 1A and 1B, each port 106 of a DUT 104 is interconnected to the testing resources along with a plurality of tuning components 108 (e.g., capacitive and inductive elements) that may be placed into the circuit between the particular ports 106 and the testing resources to ensure that a desired impedance of the circuit is reached. An impedance mismatch between a DUT 104 and the testing resources 110 may result in an improper power measurement (due to RF energy bouncing back on the RF line because of the impedance mismatch). Tuning components 108 are capacitors and/or inductors that may be soldered into RF pathways between individual ports and testing resources. As discussed herein, the tuning components 108 may be selected such that the DUT 104 impedance is matched to the testing environment impedance. For example, when a DUT 104 with a desired 50 ohm impedance is connected to testing resources via a device interface board 102, the resulting impedance of the testing system may be other than the desired 50 ohms. Therefore, tuning components 108 of the desired capacitance/impedance values may be placed close to the DUT 102 undergoing RF tuning to ensure that the DUT 102 is matched to the testing environment impedance. An optimal testing environment will imitate the environment that the DUT will experience.

The RF tuning (or impedance matching) of a port 106 to the testing environment may follow one or more RF tuning design approaches. For example, graphical RF tuning designs may utilize a Smith Chart methodology. An exemplary, simplified Smith chart is illustrated in FIGS. 2A-2F. When using a Smith Chart, it is usually assumed that the electrical locations of the tuning elements 108 are known and that component behavior is ideal. However, as discussed herein, in a typical device interface board 102 environment, RF tuning element locations 108 may be spread out because of layout constraints, and a monitoring network analyzer may also be displaced a significant distance from the RF tuning elements 108, with various other kinds of components (e.g., baluns and switches) placed in-between.

These RF tuning component location uncertainties along with path losses and non-ideal component behaviors due to parasitics, may effectively render useless any Smith Chart approach for RF tuning. The distance between the DUT and the testing resources also produces latency problems which renders the Smith chart approach even more inadequate. Therefore, because a strictly-graphical RF tuning design approach is impracticable, other approaches are needed.

The above-described graphical RF tuning process is often replaced by time-consuming, trial-and-error methodology. Such trial-and-error RF tuning processes tend to be highly empirical, serial, and time intensive. For example, when following a trial-and-error process, one or more RF tuning elements 108 are laboriously varied over time until adequate RF tuning element matches are achieved for each RF path (that is, for each port 106 of the DUT 104). As the number of RF ports 106 for wireless devices increases, the complexity and time required to achieve optimal RF tuning increases undesirably.

Not only is such trial-and-error costly and inefficient, it can also damage the DUT because of constant heating and reheating of the circuit board while populating and removing the various tuning elements. This damage can not only render the DUT inoperable, but may result in a DUT that does not act as an undamaged DUT, such that the testing would be faulty and unreliable.

What is therefore needed is a method and apparatus to more accurately and methodically tune the RF port.

3.0 SUMMARY OF THE INVENTION

Embodiments of the present invention provide solutions to the challenges inherent in efficiently tuning RF ports while avoiding conventional labor-intensive, step-by-step processes. In a method according to one embodiment of the present invention, a process for simultaneously adjusting and tuning a plurality of RF devices is disclosed.

A preferred method uses at least three tuning blocks (comprised of capacitors and inductors) in a series topology, and at least three tuning blocks in a shunt topology. These tuning blocks will yield two circles that can be charted on the Smith chart. Those circles are then centered along the centerline of the Smith chart to adjust for latency, and expanded to adjust for the losses. In particular, the series circle is expanded until its edge reaches the edge of the Smith chart (i.e., infinite resistance), and the shunt circle is expanded until its edge reaches the other edge of the Smith chart (i.e., zero resistance). Once those circles have been expanded, the circle (either series or shunt) that encompasses one of the Smith chart reference circles is identified and the traditional Smith chart methodology can be used to tune the circuit.

The process of centering the created shunt and series circles calibrates for the lag/delay inherent in the testing environment where the testing resource is a non-negligible distance from the DUT. The process of expanding the shunt and series circles calibrates for the losses between the DUT and the testing resource. Thus, by accounting for loss and latency, the testing equipment is calibrated such that it more accurately interfaces with the DUT, enabling more accurate and reliable testing.

The method described herein can be incorporated as part of the testing equipment. For example, the testing equipment may include three series blocks and three shunt blocks on a circuit board, which may be incorporated with the interface board. The testing equipment may then obtain measurements from each of the blocks and execute the method described above. In this fashion, the testing equipment can calibrate and achieve more accurate RF tuning.

4.0 BRIEF DESCRIPTION OF THE DRAWINGS

The present invention will be better understood from the following detailed description, taken in conjunction with the accompanying drawing figures in which like reference characters designate like elements, and in which:

FIG. 4A illustrates an exemplary Smith Chart with four measured impedance values;

FIG. 4B illustrates an exemplary Smith Chart with a circle fitted to the four measured impedance values of FIG. 4A;

FIG. 4C illustrates an exemplary Smith Chart where the fitted circle of FIG. 4B has been relocated on the centerline of the Smith Chart;

FIG. 4D illustrates an exemplary Smith Chart with the fitted circle of FIG. 4C expanded to touch the Smith Chart unit circle;

5.0 DETAILED DESCRIPTION

Figure 1A:
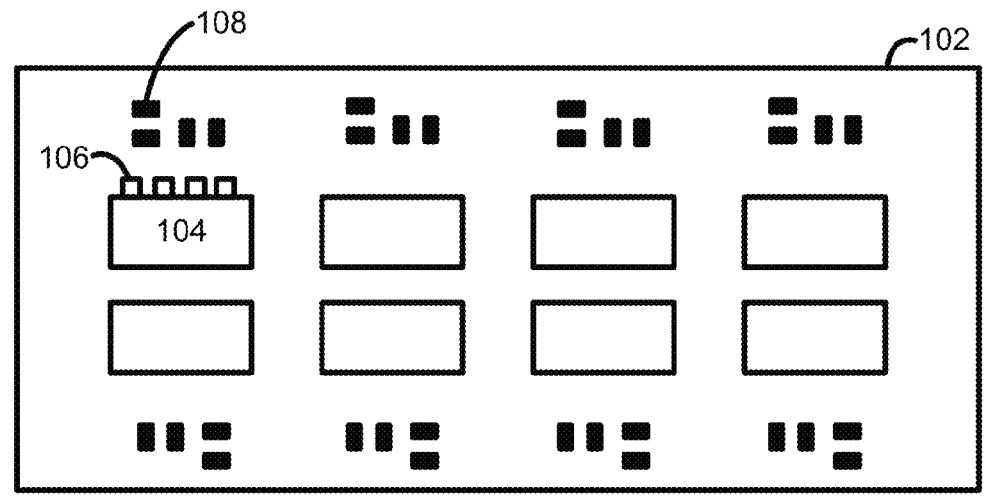
FIG. 1A illustrates an exemplary device interface board comprising a plurality of devices under test and tuning elements for RF tuning the devices under test.

Reference will now be made in detail to the preferred embodiments of the present invention, examples of which are illustrated in the accompanying drawings. While the invention will be described in conjunction with the preferred embodiments, it will be understood that it is not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings, for ease of description, generally show similar orientations, this depiction in the Figures is arbitrary for the most part. Generally, the invention can be operated in any orientation.

The present invention provides a solution to the increasing challenges inherent in lumped-element radio frequency (RF) tuning, and relates more specifically to a calibration process for lumped-element RF tuning. Various embodiments of the present invention provide an efficient process for lumped-element RF tuning. As discussed in detail below, exemplary embodiments adopt a parallel parametric sweep approach to RF tuning, in contrast to a conventional, empirical step-by-step serial process. By adopting a controlled parametric sweep, the RF tuning network may be characterized thoroughly and systematically.

Figure 2A:
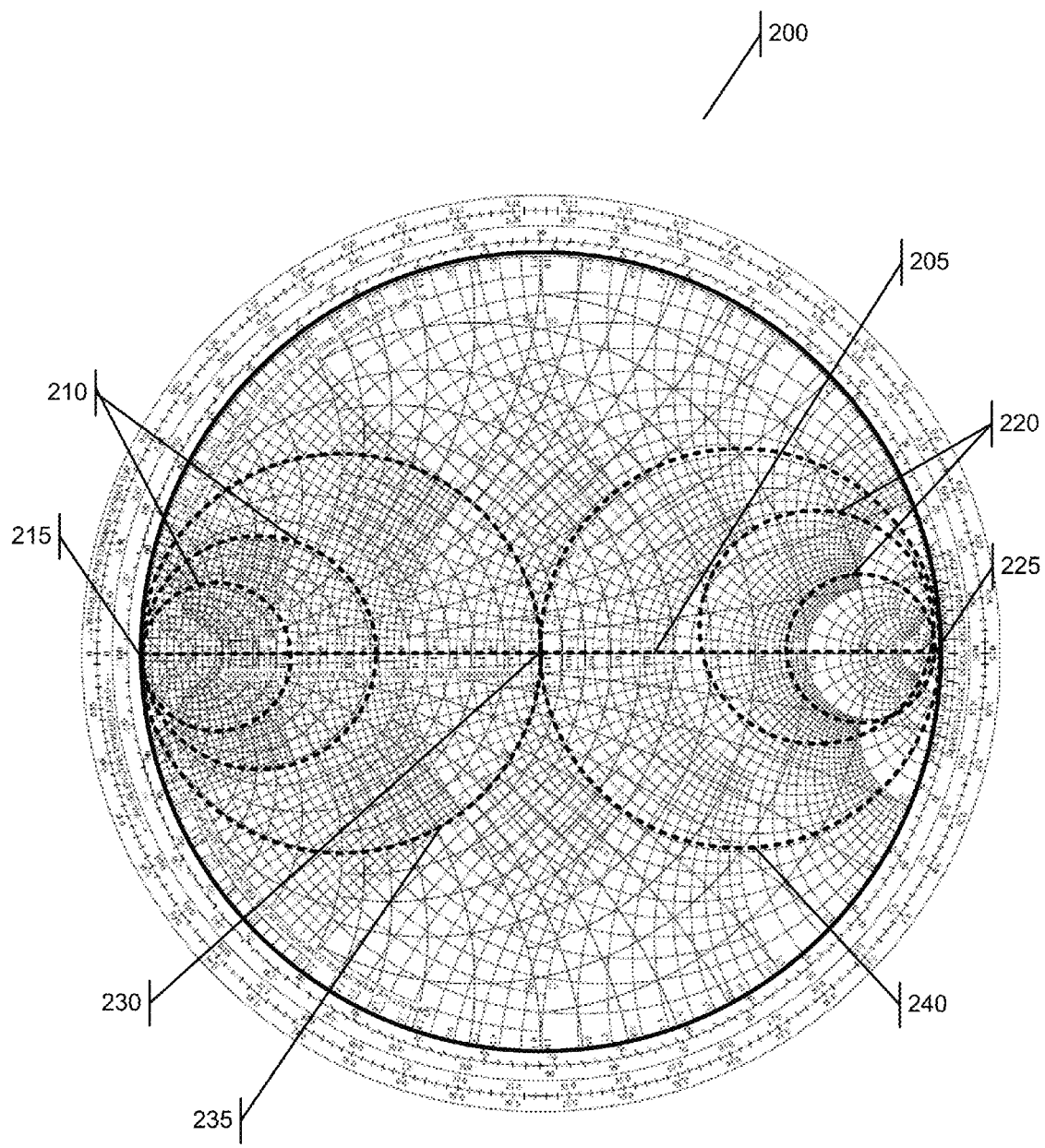
FIG. 2A illustrates an exemplary Smith Chart.

5.1 Smith Graphical Tuning:

In the theoretical Smith graphical tuning scheme, the impedance of the DUT is plotted on the Smith chart. By way of background and referring to FIG. 2A, the Smith chart 200 contains a centerline 205 upon which several circles are plotted. To the left of the Smith chart are shunt circles 210 that each touch the resistance on the centerline at position zero (215), and on the right are series circles 220 that each touch the resistance on the centerline at position ∞ (225). There is only one point on the centerline 205 where the shunt circles and the series circles of identical size meet and that is shown at position 230. This is the position that matches the desired impedance of the DUT. The ultimate goal of Smith graphical tuning is to reach position 230 on the chart.

The shunt circles 210 refer to the tuning elements placed in a shunt topology—i.e., where they are in parallel to the DUT and grounded. This is shown in FIG. 1C where the DUT 104 has a tuning element 108 in parallel that is grounded. The series circles 220 refer to the tuning elements placed in a series topology—i.e., where they are in series with the DUT. This is shown in FIG. 1D, where the DUT 104 has tuning elements 108 in series. Traveling along a shunt circle requires that the tuning elements be placed into a shunt topology. Similarly, traveling along a series circle requires that the tuning elements be placed into a series topology.

The general method is to plot the impedance of the DUT on the Smith chart. The impedance of the DUT can be tuned either in a shunt or series topology, thus traveling along either a shunt circle or series circle. Since the goal of tuning is the reach the desired impedance of the DUT (i.e., position 230) and the impedance can only travel along the shunt/series circles, it becomes evident that either the shunt circle 235 or the series circle 240 must be the final circle that must be used to reach position 230.

Figure 2B:
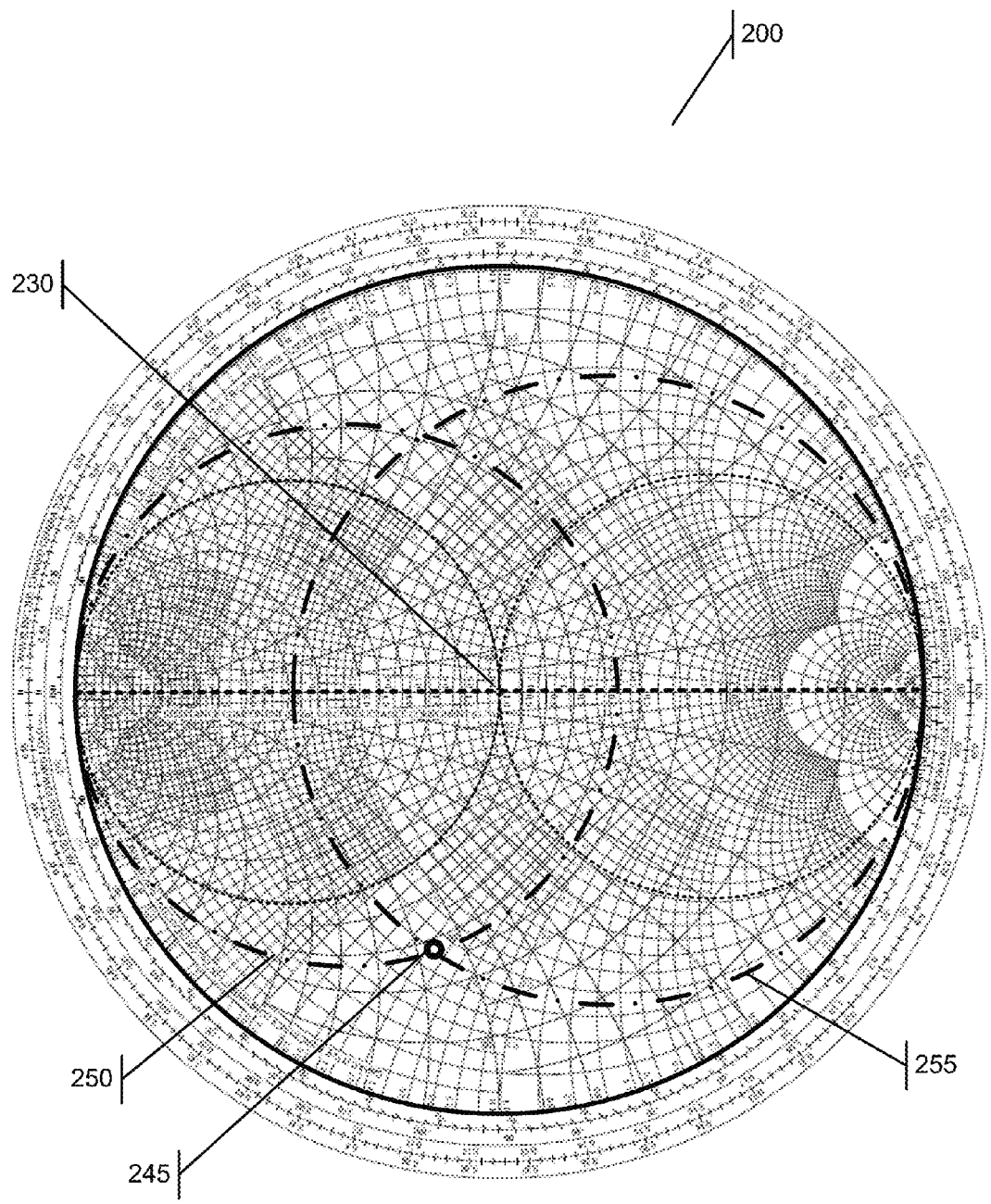
FIG. 2B illustrate an exemplar of a DUT diagrammed on the Smith Chart.
Figure 2C:
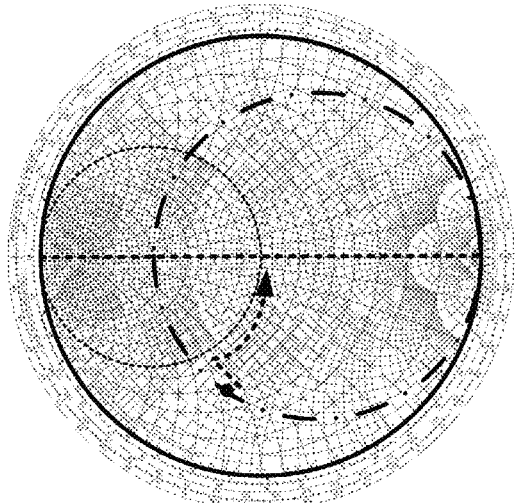
FIG. 2C illustrates a first pathway to reach impedance matching using the Smith Chart.
Figure 2D:
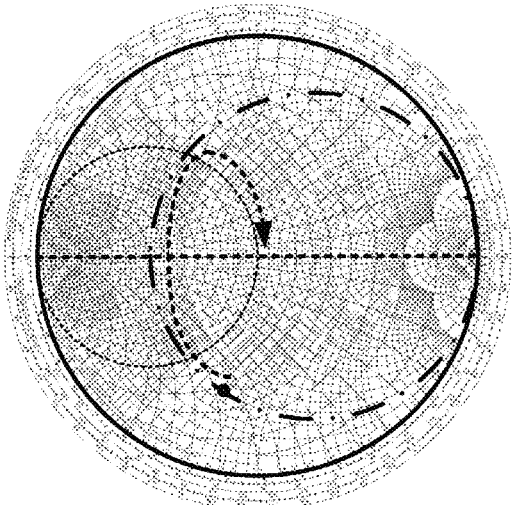
FIG. 2D illustrates a second pathway to reach impedance matching using the Smith Chart.
Figure 2E:
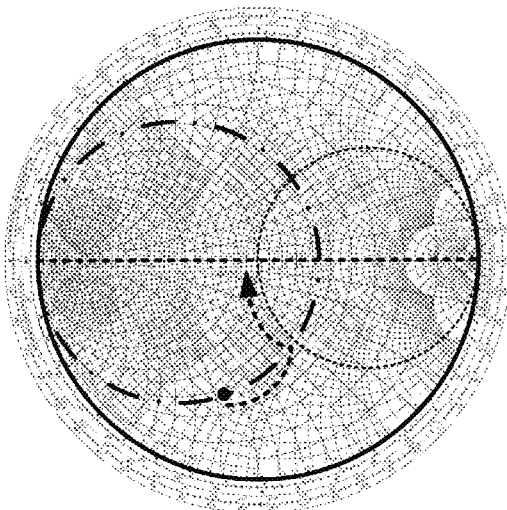
FIG. 2E illustrates a third pathway to reach impedance matching using the Smith Chart.
Figure 2F:
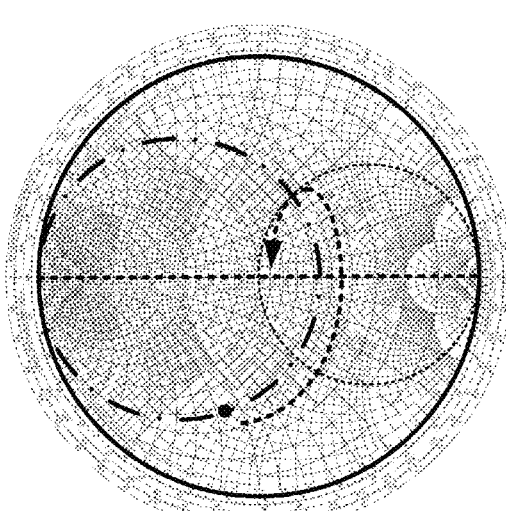
FIG. 2F illustrates a fourth pathway to reach impedance matching using the Smith Chart.

Turning to FIG. 2B, an exemplar tuning will be illustrated. If the DUT impedance is measured at position 245 on the Smith chart, there are two circles that intersect that point; shunt circle 250 and series circle 255. Inspection reveals that four possible tuning paths to position 230 exist. FIGS. 2C and 2D show the first two options which use the series circle first and then the shunt circle to arrive at position 230. FIGS. 2E and 2F show the two other options, which use the shunt circle first and then the series circle to arrive at position 230. Next, to obtain a more detailed circuit topology (series/ shunt) and type of tuning elements (inductor or capacitor), the following rules may be used:
1. Upward direction uses an inductor, downward direction uses a capacitor;
2. Impedance tuning circle uses a series element, Admittance tuning circle uses a shunt element.
3. The paths passing through R=0 and R=∞ are forbidden.

Using the Smith chart tuning method, at least theoretically, allows for impedance matching for more accurate testing of the DUT. But that is the problem; the Smith graphical tuning method tunes the DUT at a location that is extremely close to the DUT such that the Smith tuning method does not account for losses or latency effects. And that is why the Smith graphical tuning method is often not used because it is inaccurate, and those in the art instead use the laborious and potentially-damaging trial-and-error method to tune the DUT.

Figure 1B:
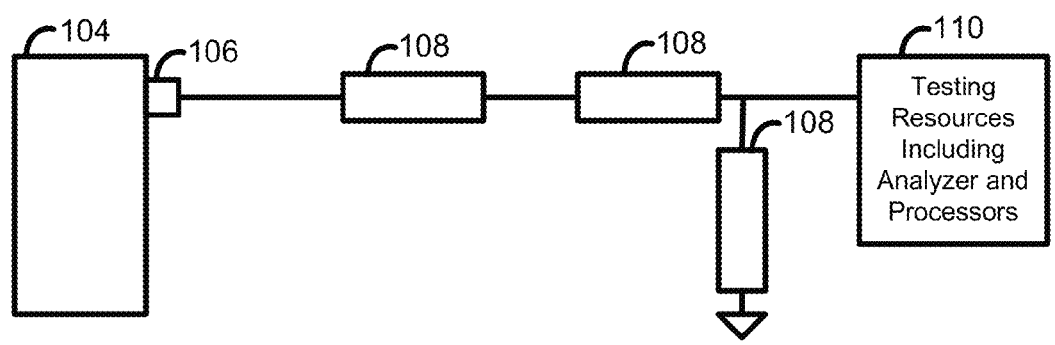
FIG. 1B illustrates an exemplary device under test interconnected to testing resources via tuning elements that provide impedance matching between the device under test and a testing environment.
Figure 1C:
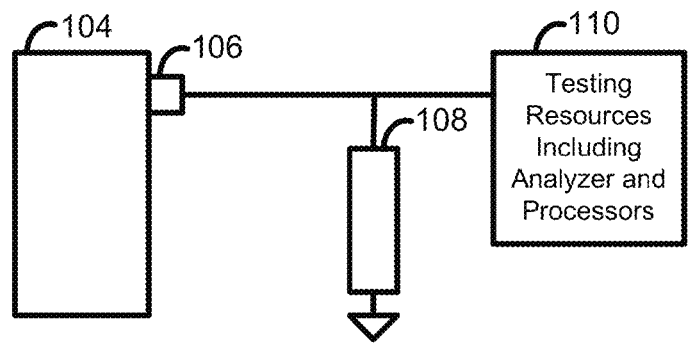
FIG. 1C illustrates the tuning elements in a shunt topology.
Figure 1D:
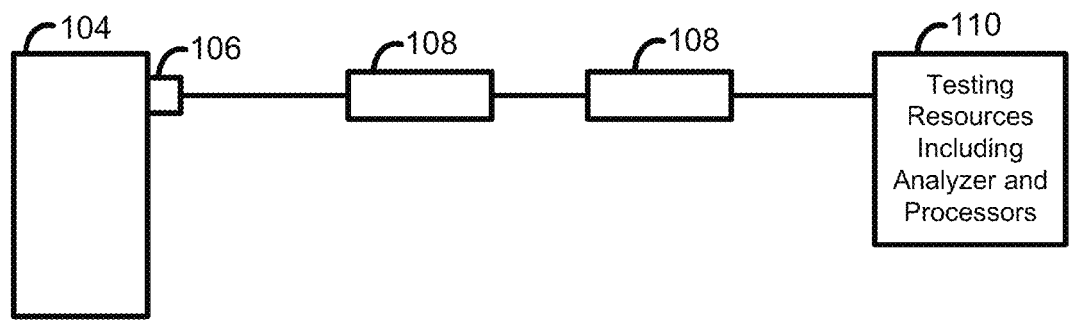
FIG. 1D illustrates the tuning elements in a series topology.

5.2 Lumped-Element Radio Frequency Tuning Calibration Process:

As shown in FIGS. 1A and 1B, in one exemplary embodiment, a network analyzer 110 monitors an exemplary path to a plurality of RF tuning elements 108 and a load (e.g., a port 106). In one exemplary embodiment, there may be eight DUTs 104 placed on a device interface board 102; however, other quantities of DUTs 104 are also envisioned, such as 16 or more DUTs 104.

The method essentially places a number of tuning elements in series with the DUT and maps those locations to the Smith chart. Then the same is done for a number of tuning elements in a shunt topology, mapping those locations to the Smith chart. As will be apparent to one of skill in the art, only three alternate tuning elements need to be used for each of the shunt and series circles to define a circle. Once the circles are defined, they are centered along the centerline, then expanded to reach either conductance of ∞ (R=0) for the shunt circles or conductance of 0 (R=∞) for the series circles. This essentially calibrates the testing system to account for loss and latency. The method can be done quickly in the testing resource 110 which includes an electronic processor.

Figure 3:
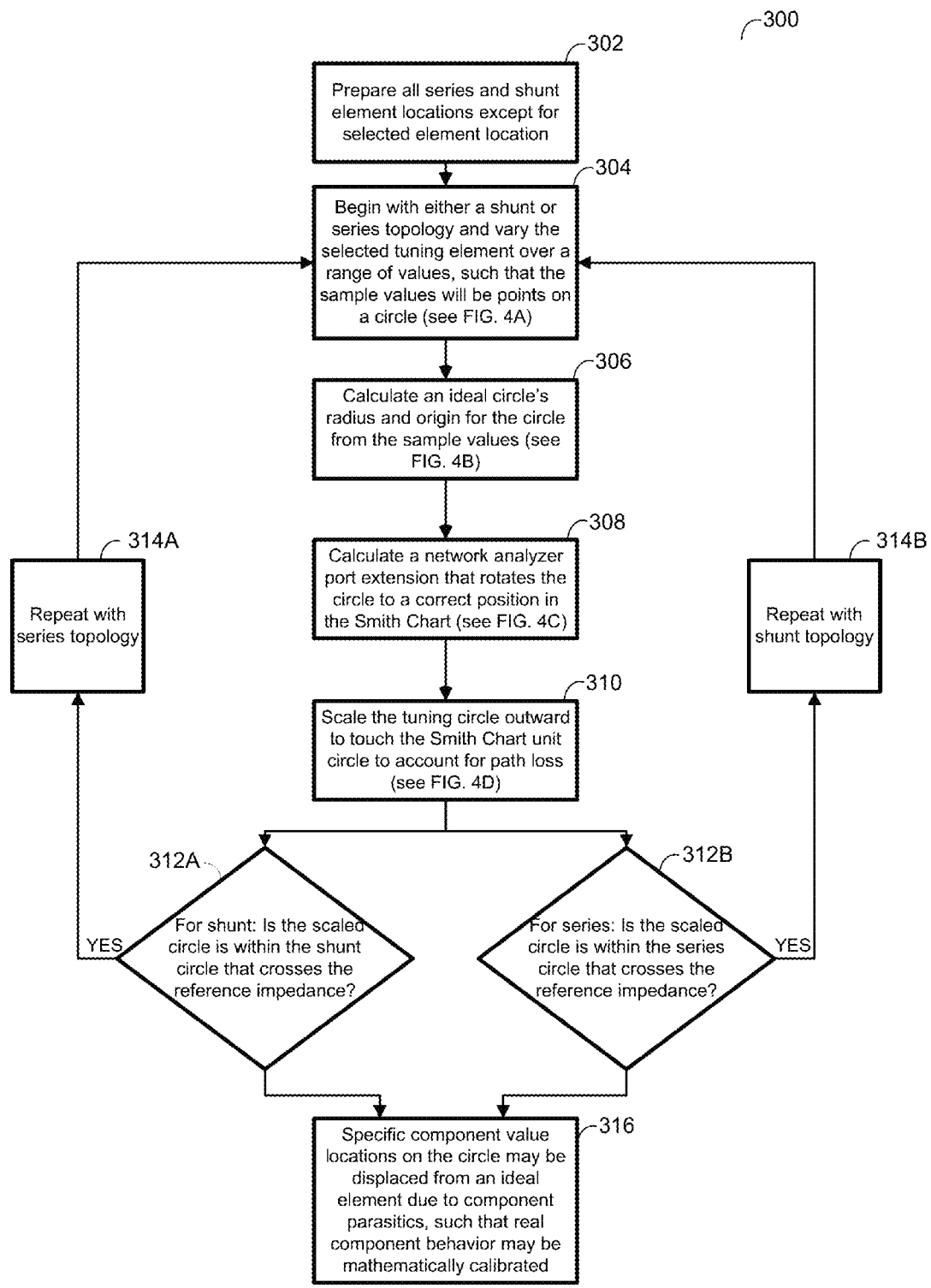
FIG. 3 illustrates a flow diagram of the steps in a process for lumped-element RF tuning.

Referring to FIG. 3, a method 300 to calibrate the system is shown. In step 302, the series and shunt element locations except for a selected element location are prepared. Either a shunt or series topology is selected, and the tuning element is systematically varied over a range of values in both capacitance and/or inductance in step 304. The exemplary path's locus of the various tuning elements seen at the monitoring network analyzer 110 will be points on a circle in a Smith Chart. At least three variations are needed to form a circle, but more variations will help in determining a more precise circle. The impedance for each of the variations is then plotted on the Smith Chart. As shown in FIG. 4A, four shunt variations are plotted (405). Then at step 306 an ideal circle 408 is fitted to the variations (this is shown in FIG. 4B). This fitting may be accomplished using a circle fitting routine (e.g., a Taubin method).

Next, at step 308, a network analyzer port extension is calculated that rotates the circle (shown by arrow 408) to a correct position in the Smith Chart—i.e., the fitted circle is placed on the centerline of the Smith Chart as shown in FIG. 4C. This rotation calibrates for the lag/latency issues. Usually the transmission lines are designed to match the system impedance so this rotation is about the center point of the Smith chart—i.e., point 230.

With the tuning circle rotated properly, at step 310, the tuning circle may be scaled outward (shown by arrow 409) to touch the Smith Chart unit circle to account for any path loss (see FIG. 4D). Such exemplary path loss may be considerable if the path from the RF tuning network to the network analyzer goes through a balun and an RF switch. It should be apparent to one of skill in the art that the order of steps 308 and 310 can be flipped such that the fitted circle can first be expanded to hit the Smith Chart unit circle (step 310) and then the expanded circle can be placed on the center line (step 308). These two steps are essentially independent, and thus the order is not critical.

Because a shunt topology was used, the preferred method determines whether the fitted and calibrated circle can then be used in the theoretical Smith graphical tuning method discussed above. In FIG. 4D, the resulting circle for the DUT (labeled 410) does not intersect either of the circles (235 and 240) that cross the reference impedance at location 230. Therefore, the Smith graphical method cannot be employed to arrive at position 230 with the current circle 410 shown in FIG. 4D. The method must be repeated with a series topology, which will ultimately yield a series circle that will intersection the shunt circle 235 and allow position 230 to be achieved.

For this reason, step 312A determines whether, for a shunt topology, the fitted shunt circle 410 is within the shunt circle 235. If it is, then the method proceeds to step 314A and repeats to calculate a fitted series circle. If the answer at decision step 312A is no, then either the fitted circle is the same as the shunt circle 235 or larger. In either case, there is a path to reach the reference impedance at position 230.

It should be apparent that if instead of beginning with a shunt topology, a series topology was chosen as the starting point, steps 302 through 310 are the same. At step 312B, the method checks to see if a path exists to reach position 230.

Now that the RF tuning element data points fall on a proper series or shunt Smith Chart circle, specific component value locations on the circle may be displaced from an ideal element due to component parasitics. Since there is measured data for the RF tuning elements, as well as for the ideal values, the real RF component behaviors may be mathematically calibrated.

Figure 5A:
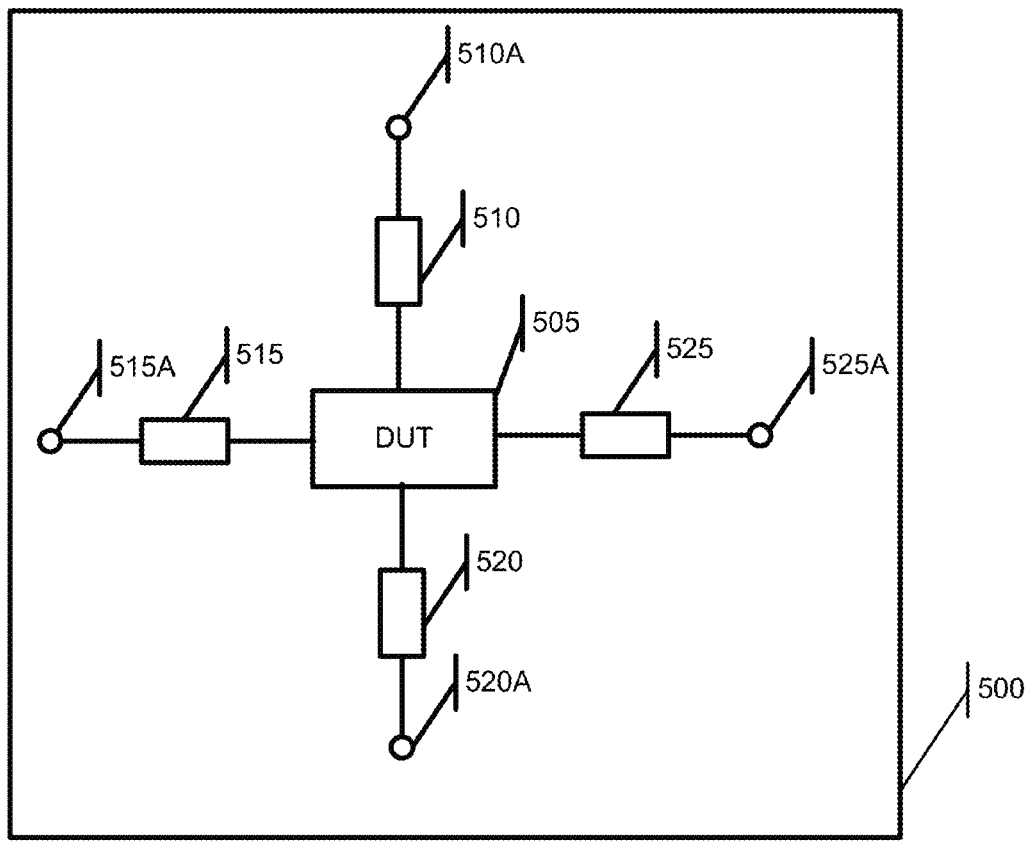
FIG. 5A illustrates a printed circuit board with four tuning elements in a series topology.

Instead of requiring a technician to manually vary the tuning elements to achieve the at least three measurements needed to create the shunt (or series) circle, the tuning elements may be placed on a printed circuit board such that the analyzer can automatically take the measurements and calibrate. FIG. 5A illustrates such a circuit board 500 with four tuning elements in a series topology. Each of the tuning elements (510, 515, 520 and 525) is varied, and the analyzer can take impedance measurements for each tuning element at positions 510A, 515A, 520A and 525A, respectively. From these measurements, the analyzer can plot the impedances on the Smith chart, fit a series circle, center that circle and expand the circle as detailed above. Those steps can then be used to calibrate the testing equipment. While printed circuit board 500 has four series variations, the calibration can be done with as little as three. The printed circuit board 500 described with reference to FIGS. 5A and 5B may be integrated with the interface board 102 described with reference to FIG. 1A.

Figure 5B:
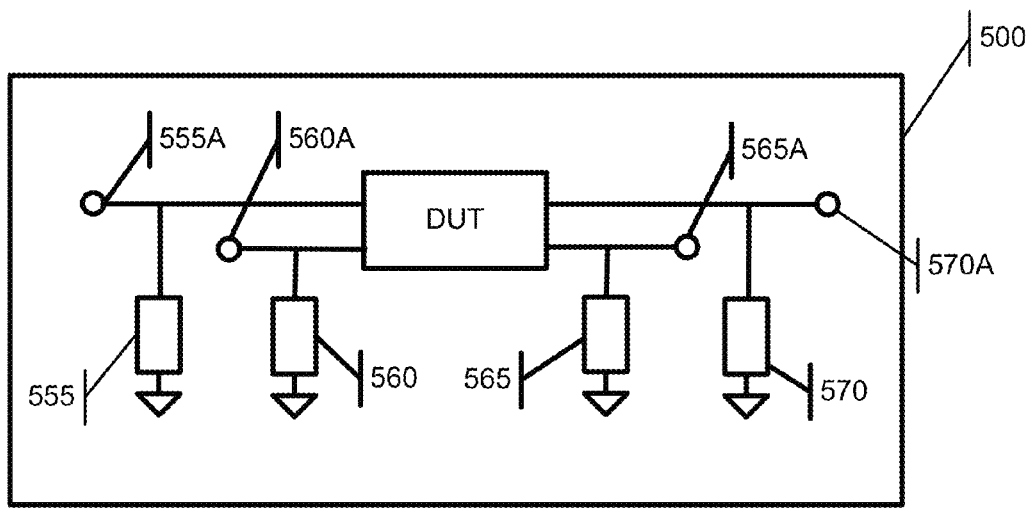
FIG. 5B illustrates a printed circuit board with four tuning elements in a shunt topology.

The printed circuit board may also include four tuning components in a shunt topology as shown in FIG. 5B. Each of the tuning elements (555, 560, 565 and 570) is varied, and the analyzer can take impedance measurements for each tuning element at positions 555A, 560A, 565A and 570A, respectively. From these measurements, the analyzer can plot the impedances on the Smith chart, fit a shunt circle, center that circle and expand the circle as detailed above. Those steps can then be used to calibrate the testing equipment. While printed circuit board 500 has four shunt variations, the calibration can be done with as little as three.

To initially calibrate the system, a device with a known and stable resistance/conductance may be selected (for example, a resistor with a highly accurate and stable value, say 200 Ω) and used as the DUT. The system then performs the calibration knowing precisely what the DUT impedance should measure.

Although certain preferred embodiments and methods have been disclosed herein, it will be apparent to those skilled in the art from the foregoing disclosure that variations and modifications of such embodiments and methods may be made without departing from the spirit and scope of the invention. It is intended that the invention shall be limited only to the extent required by the appended claims and the rules and principles of applicable law.

The invention claimed is:

1. A method for tuning a radio frequency network, the method comprising:
   a. selecting and placing at least three tuning elements on a device interface board, wherein each of the tuning elements is connected to a device under test (DUT) in either a series topology or a shunt topology;
   b. taking impedance measurements of the at least three tuning elements with a signal analyzer and plotting data points representive of the impedance measurement on a Smith chart; and
   c. characterizing at least one circle within the Smith chart using the produced data points by:
   d. fitting a circle on the Smith chart based on the data points;
   e. placing the fitted circl on a centerline of the Smith chart, wherein the centerline includes a value of zero resistance on one end of the centerline and a value of infinite resistance on the other end of the centerline, and a center point equidistant from the ends of the centerline; and
   f. for a circle based on a shunt topology, expanding the fitted circle to touch the value of zero resistance on the centerline; and
   g. for a circle based on a series topology, expanding the fitted circle to touch the value of infinite resistance on the centerline.

2. The method of claim 1, further comprising:
   h. for an expanded circle based on a shunt topology, if the expanded circle is circumscribed by a shunt circle that includes the center point and the value of zero resistance then repeat steps (a) through (g) using a series topology; and
   i. for an expanded circle based on a series topology, if the expanded circle is circumscribed by a shunt circle that includes the center point and the value of infinite resistance then repeat steps (a) through (g) using a shunt topology.

3. The method of claim 2, further comprising:
   for an expanded circle based on a shunt topology, traveling along the expanded circle until it intersects a series circle that includes the center point and the value of infinite, then traveling along the series circle to the center point;
   for an expanded circle based on a series topology, traveling along the expanded circle until it intersects a shunt circle that includes the center point and the value of zero, then traveling along the shunt circle to the center point.

4. The method of claim 3, further comprising:
   tuning the radio frequency network based on the path taken to reach the center point.

5. The method of claim 1, further comprising:
   calibrating the radio frequency network based on the movement of the fitted circle onto the centerline and the amount the fitted circle is expanded.

6. The method of claim 5, wherein the DUT is an electrical component of a known and stable impedance.

7. A system for testing a device under test (DUT), the system comprising:
   a device interface board comprising a radio frequency (RF) port configured to connect to the DUT and at least three tuning elements, wherein each of the tuning elements is connected to the DUT in either a series topology or a shunt topology;
   a signal analyzer connected to the interface board and configured to perform diagnostic testing on the DUT;
   a computer processor connected to the interface board and the signal analyzer, the processor configured to perform the following steps:
   a. obtaining impedance measurement for each of the at least three tuning elements from the signal analyzer and plotting data points representative of the impedance measurements on a Smith chart; and
   b. characterizing at least one circle within the Smith chart using the obtained data points by;
   c. fitting a circle on the Smith chart based on the data points;
   d. placing the fitted circle on a centerline of the Smith chart, wherein the centerline includes a value of zero resistance on one end of the centerline and a value of infinite resistance on the other end of the centerline, and a center point equidistant from the ends of the centerline, and
   e. for a circle based on a shunt topology, expanding the fitted circle to touch the value of zero resistance on the centerline; and
   f. for a circle based on a series topology, expanding the fitted circle to touch the value of infinite resistance on the centerline.

8. The system of claim 7, wherein the processor performs the following additional steps:
   g. for an expanded circle based on a shunt topology, if the expanded circle is circumscribed by a shunt circle that includes the center point and the value of zero resistance then repeat steps (a) through (f) using a series topology; and
   h. for an expanded circle based on a series topology, if the expanded circle is circumscribed by a shunt circle that includes the center point and the value of infinite resistance then repeat steps (a) through (f) using a shunt topology.

9. The system of claim 7, wherein the processor performs the following additional step of calibrating the system based on the movement of the fitted circle onto the centerline and the amount the fitted circle is expanded.

10. The system of claim 9, wherein the DUT is an electrical component of a known and stable impedance.

11. The system of claim 7, wherein the processor performs the following additional steps:
    for an expanded circle based on a shunt topology, traveling along the expanded circle until it intersects a series circle that includes the center point and the value of infinite resistance, then traveling along the series circle to the center point;

for an expanded circle based on a series topology, traveling along the expanded circle until it intersects a shunt circle that includes the center point and the value of zero resistance, then traveling along the shunt circle to the center point.

12. The system of claim 11, wherein the processor tunes the RF port based on the path taken to reach the center point.

13. A system for testing a device under test (DUT), the system comprising:
- a device interface board comprising a radio frequency (RF) port configured to connect to the DUT and at least six tuning elements, wherein three of the tuning elements are connected to the DUT in a series topology, and three are connected to the DUT in a shunt topology,
- a signal analyzer connected to the interface board and configured to perform diagnostic testing on the DUT;
- a computer processor connected to the interface board and the signal analyzer, the processor configured to perform the following steps:
  - a. obtaining from the signal analyzer impedance measurements for the three tuning elements in the series topology and plotting data points representative of the impedance measurements on a Smith chart;
  - b. obtaining from the signal analyzer impendence measurements for the three tuning elements in the shunt topology and plotting data points representative of the impedance measurements on the Smith chart;
  - c. characterizing at least one series circle within the Smith chart using the data points obtained from the three tuning elements in the series topology; and
  - d. characterizing at least one shunt circle within the Smith chart using the data points obtained from the three tuning elements in the shunt topology;
  wherein the step of characterizing the at least one circle within the Smith chart comprises;
  - e. fitting a series circle on the Smith chart based on the data points obtained from the three tuning elements in the series topology;
  - f. fitting a shunt circle on the Smith chart based on the data points obtained from the three tuning elements in the shunt topology;
  - g. placing both the series and shunt fitted circles on a centerline of the Smith chart, wherein the centerline includes a value of zero resistance on one end of the centerline and a value of infinite resistance on the other end of the centerline, and a center point equidistant from the ends of the centerline; and
  - h. expanding the fitted shunt circle to touch the value of zero resistance on the centerline; and
  - i. expanding the fitted series circle to touch the value of infinite resistance on the centerline.

14. The system of claim 13, wherein the processor performs the following additional step of calibrating the system based on the movement of the fitted series circle onto the centerline and the amount the fitted series circle is expanded.

15. The system of claim 13, wherein the processor performs the following additional step of calibrating the system based on the movement of the fitted shunt circle onto the centerline and the amount the fitted shunt circle is expanded.

16. The system of claim 13, wherein the processor performs the following additional step of traveling along the expanded shunt circle until it intersects a series circle that includes the center point and the value of infinite resistance, then traveling along the series circle to the center point.

17. The system of claim 16, wherein the processor tunes the RF port based on the path taken to reach the center point.

18. The system of claim 13, wherein the processor performs the following additional step of traveling along the expanded series circle until it intersects a shunt circle that includes the center point and the value of zero resistance, then traveling along the shunt circle to the center point.

19. The system of claim 18, wherein the processor tunes the RF port based on the path taken to reach the center point.

* * * * *